United States Patent [19]

Ellbrunner et al.

[11] Patent Number: 4,725,423
[45] Date of Patent: Feb. 16, 1988

[54] PROCESS FOR THE REGENERATION OF SHAPED CARBON BODIES

[75] Inventors: Adalbert Ellbrunner, Seibersdorf, Fed. Rep. of Germany; Georg Priewasser, Ach, Austria; Horst Stock, Burghausen, Fed. Rep. of Germany

[73] Assignee: Wacker-Chemitronic Gesellschaft fur Elektronik-Grundstoffe mbH, Burghausen, Fed. Rep. of Germany

[21] Appl. No.: 826,745

[22] Filed: Feb. 6, 1986

[30] Foreign Application Priority Data

Mar. 13, 1985 [DE] Fed. Rep. of Germany ....... 3508999

[51] Int. Cl.$^4$ .................. C01B 31/02; C09C 1/56
[52] U.S. Cl. ..................... 423/445; 423/448; 423/460; 423/461
[58] Field of Search ............... 423/445, 448, 460, 461; 502/56

[56] References Cited

U.S. PATENT DOCUMENTS

| | | | |
|---|---|---|---|
| 2,260,746 | 10/1941 | Hanawalt et al. | 423/448 |
| 4,030,876 | 6/1977 | Akae et al. | 502/56 |
| 4,199,872 | 4/1980 | Bischoff | 502/56 |
| 4,225,463 | 9/1980 | Unger et al. | 423/448 |

FOREIGN PATENT DOCUMENTS

| | | | |
|---|---|---|---|
| 56-140018 | 11/1981 | Japan | 423/445 |
| WO83/00682 | 3/1983 | PCT Int'l Appl. | 423/445 |

OTHER PUBLICATIONS

Lewis et al., Vitreous Carbon as a Crucible Material for Semiconductors, Solid–State Electronics 1963, vol. 6, pp. 251–254.

Primary Examiner—Gregory A. Heller
Assistant Examiner—Robert M. Kunemund
Attorney, Agent, or Firm—Collard, Roe & Galgano

[57] ABSTRACT

A process and apparatus for the regeneration of shaped carbon, and especially graphite, bodies used in the presence of molten silicon. The shaped bodies are heated in an inert atmosphere to a temperature in the range of from 1700° to 3000° C. and maintained at this temperature for a defined period of time. The process substantially prolongs the service life of the shaped bodies. The apparatus includes at least one evacuable loading chamber, and evacuable heatable heating chamber connected to the loading chamber and an evacuable coolable cooling chamber connected to the heating chamber. A support capable of moving between the loading, heating and cooling chambers is adpated for receiving the shaped bodies to be regenerated.

5 Claims, 1 Drawing Figure

U.S. Patent    Feb. 16, 1988    4,725,423
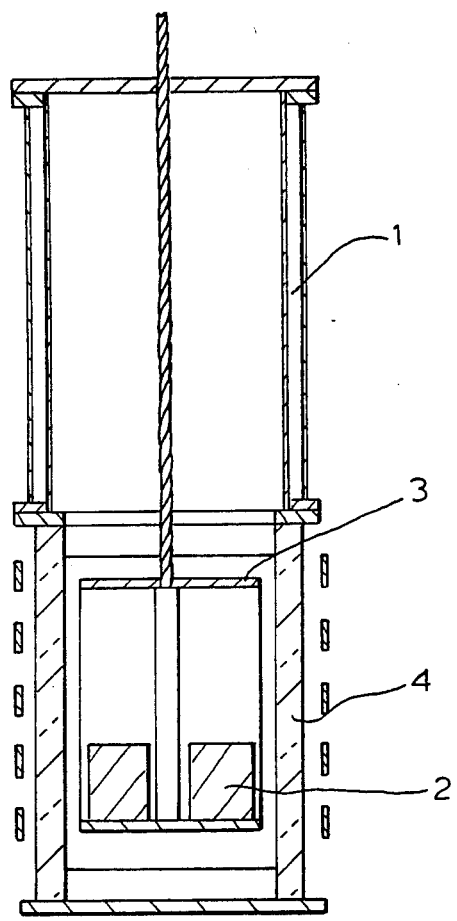

PROCESS FOR THE REGENERATION OF SHAPED CARBON BODIES

BACKGROUND OF THE INVENTION

The invention relates to a process for the regeneration of shaped bodies made of carbon and, in particular, graphite, which are used in the presence of elemental molten silicon, as well as to an apparatus for carrying out this process.

In high-temperature processes for technological applications, carbon and, in particular graphite, has been found to be a material with excellent properties. Even within the scope of the manufacture of high-purity elemental silicon as a base material for electronic components, solar cells or micro-mechanical components, carbon and especially graphite are used in the high-temperature steps. Carbon is used in this manufacture even though a direct contact between molten silicon and shaped carbon bodies has to be avoided as much as possible because of the formation of silicon carbide, which starts at high temperatures. For this reason, in processes, for example, requiring large amounts of molten silicon, e.g. in the pulling of silicon rods in crucibles according to the Czochralski process, or in the casting of silicon blocks, the melt is normally loaded in quartz crucibles which are externally surrounded by graphite crucibles. Although the graphite crucibles are therefore not in direct contact with the molten silicon, they are nevertheless highly stressed in these processes. Their frequent replacement is required due to the fact that their surfaces start to become brittle causing cracking and spalling, or their thermal conductivity and radiation characteristics change. Since these crucibles, often having large dimensions (typically about 400 mm diameter and about 300 mm height), have to be manufactured from massive blocks of graphite in most cases, their manufacture is expensive and complicated. Thus a frequent replacement of the crucible incurs significantly higher costs.

Accordingly it is an object of the present invention to provide a process for prolonging the useful life of shaped bodies made of carbon, and in particular graphite, which are used in the presence of elemental molten silicon.

SUMMARY OF THE INVENTION

The foregoing and related objects are readily attained in a process for the regeneration of shaped carbon bodies following their use in the presence of elemental molten silicon wherein the shaped carbon bodies are heated to a temperature in the range of 1700° to 3000° C. in an atmosphere that is inert to carbon and, in particular, graphite. The shaped bodies are maintained at a temperature within this temperature range for a period in hours equal to 0.05 to 1 times the value of the wall thickness of the shaped bodies, measured in millimeters.

The foregoing and related objects are also attained according to the invention by the provision of an apparatus for regenerating shaped carbon bodies that includes at least one evacuable loading chamber and an evacuable, heatable heating chamber connected to the loading chamber. An evacuable coolable cooling chamber is connected to the heating chamber. A support capable of moving between the loading, heating, and cooling chambers is adapted for receiving the shaped bodies to be regenerated. The loading chamber and the cooling chamber may be combined into a single loading and cooling chamber. In addition, the combined loading and cooling chamber may be disconnectable from the heating chamber.

Other objects and features of the present invention will become apparent from the following detailed description considered in connection with the accompanying drawing, which discloses one embodiment of the invention. It is to be understood that the drawing is to be used for the purpose of illustration only, and not as a definition of the limits of the invention.

BRIEF DESCRIPTION OF THE DRAWING

The drawing is a schematic representation of an apparatus for carrying out the process of the invention.

DETAILED DESCRIPTION OF THE PREFERRED EMBODIMENT

As shown in the drawing, a loading chamber 1 capable of being evacuated and cooled, for example with water, and used at the same time as the cooling chamber, is charged with a support 3 loaded with the shaped bodies 2 to be heated. These bodies may be graphite crucibles, used for example in the pulling of silicon rods from crucibles according to the Czochralski process. Loaded support 3 is subsequently lowered into, e.g., an inductively heated heating chamber 4, which is capable of being sealed vacuum tight, evacuated, and flushed with inert gas. After heating chamber 4 is adjusted to a suitable pressure of, e.g., $10^{-1}$ to $10^{-3}$ mbar, with the help of, e.g., a vacuum pump (not shown in the drawing), the temperature is increased within the scheduled heating period to a selected final temperature, preferably in the range of 1900° to 2200° C. After the scheduled treatment period has elapsed, and following an additional cooling phase, if need be, support 3 is returned into the loading chamber which now acts as a cooling chamber. Chamber 1 is now evacuated or fed with inert gas and intensively cooled. Support 3 is left in the chamber until the temperature is lowered to a value at which venting can be carried out without the risk of burning, and the graphite crucibles can be removed.

Basically, the shaped bodies may be heated to the final temperature in the range of 1700° to 3000° C., preferably 1900° to 2200° C., either directly or within a heating period preferably in the range of about 2 to 8 hours. However, relatively long treatment times are required at temperatures below 1900° C. Although these periods become shorter at higher temperatures, increased loss of material due to sublimation occurs above 2200° C. In addition, the dimensional stability is reduced in the plastic temperature range above about 2500° C. Also, the expenditure in terms of apparatus requirements increases along with the increase in the temperature that has to be produced and maintained. Thus, operating temperatures above 3000° C., although basically possible, cannot be justified in light of the equipment requirements and energy consumption.

The time requirements for a regeneration prolonging a body's useful life is basically determined by the wall thickness of the shaped body, i.e., the required treatment period increases with the increase in wall thickness. As a rule, the time requirement expressed in hours conforms to 0.05 to 1 times the numerical value of the wall thickness measured in millimeters. For example, in the preferred temperature range of 1900° to 2200° C., it was found that with wall thicknesses of from 15 to 40 mm, as normally found with shaped graphite bodies, treatment periods from about 2 to 20 hours suffice. In general, the time requirement for the regeneration treatment can be reduced by increasing the temperature. However, if the treatment temperature is raised, one has to take into account the fact that adverse effects such as increased loss due to sublimation or reduction of the dimensional stability may occur.

After the high-temperature treatment has been completed, the temperature of the shaped body is lowered again. In practice, the cooling step is carried out in a separate cooling station by cooling, for example, with water. In the cooling step, the interior of the cooling station may be additionally cooled with inert gas expediently within the normal to excess pressure range. Preferably, a final temperature is selected at which loss due to burning can be avoided if contact with the open air occurs. As a rule, it is thus necessary to cool the shaped body of carbon, and particularly graphite, to from 400° to 500° C. before letting it cool further in the open air. Preferably, the cooling step is extended even further to the temperature range of 150° to 250° C. A cooling period of from 2 to 10 hours was found to be useful depending on the treatment temperature and size of the regenerated shaped body.

In order to avoid loss due to burning, the high-temperature treatment of the shaped bodies is carried out in an inert atmosphere, i.e., an atmosphere inert to carbon or graphite (i.e., inert to the material of the shaped body). Specifically, the inert atmosphere may be a vacuum, preferably at $10^{-1}$ to $10^{-3}$ mbar, or an atmosphere of protective gas. Suitable protective gases are, for example, rare gases such as helium, neon, or particularly argon. Of course, mixtures of noble gases may also be used. Basically, in temperature ranges where it is known from experience that no loss due to burning of the shaped body can occur, which is the range of up to about 400° to 500° C., the heating or cooling may be carried out in the open air.

As a rule, shaped bodies made of carbon, in particular graphite, do not have to be regenerated after each use or application, but only after a deterioration of the properties of the material is noticed. Such deterioration may be reflected by a change in the heat transfer and radiation properties, or by crusting or embrittlement of the surface. For example, with graphite crucibles which are used in the casting of silicon blocks or in the pulling of silicon rods in crucibles according to the Czochralski process, the treatment according to the invention is required only after three to twelve uses of the crucible, in order to decisively prolong the useful life between regenerations.

The process of the invention will be more fully described in the following examples, which are given by way of illustration and not of limitation.

EXAMPLE

An apparatus conventionally used for pulling silicon rods from crucibles in accordance with the Czochralski process (cf., for example, B. W. Zulehner and D. Huber, Czochralski-Grown Silicon, Crystals 8, Springer-Verlag, Berlin-Heidelberg, 1982) was equipped with a quartz crucible for receiving the melt (about 35 kg silicon), having an outer diameter of 350 mm and a height of 250 mm. The crucible was surrounded by a graphite crucible with an inside diameter of 351 mm, a height of 240 mm, and a wall thickness of 20 mm.

With this arrangement, silicon rods were pulled by a known method (cf., for example, Zulehner and Huber, loc.cit.) with a diameter of 128 mm and lengths in the range of 1000 and 1100 mm. After each pulling action, the quartz crucible was replaced, whereas the graphite crucible was retained. After each tenth pulling action, the graphite crucible was removed and regenerated in an apparatus according to the invention.

To regenerate the graphite crucible, it was placed in the loading chamber, a stainless steel cylinder capable of evacuation and water cooling, on a support made of graphite, and lowered into the heating chamber. The heating chamber consisted of a tube made of fused opaque quartz, insulated with graphite felt, and capable of being sealed vacuum-tight. An inductively heatable tube made of graphite was arranged in the quartz tube for receiving the material. The heating chamber was then evacuated to a pressure of about $10^{-2}$ mbar and the temperature was continuously raised until it came to approximately 2050° C., after about 4 hours. The crucible was then maintained at this temperature for about 5 hours. Subsequently, the heating was shut off and the crucible was allowed to cool by dissipation of the heat. At about 1700° C., the crucible was lifted from the heating chamber and returned into the loading chamber, which had been previously evacuated to about $10^{-2}$ mbar, and which was then intensively cooled with water. After a total cooling time of about 10 hours, the crucible had reached a temperature of about 200° C. and it was possible to remove it from the loading chamber after venting, and to reuse it in the crucible pulling process.

With a graphite crucible which was periodically regenerated as described above, it was possible to carry out more than 30 pulling operations. All resulting rods were free of dislocation and had reproducible oxygen and carbon contents.

COMPARATIVE EXAMPLE

Another sequence of crucible pulling operations was carried out by the procedure described above, but without regeneration of the graphite crucible used in these operations. After 6 pulling operations, the surface of the graphite crucible started to become brittle.

In the twelfth pulling operation, the crucible's thermal conduction and radiation properties had deteriorated to an extent that the resulting silicon rod exhibited increased crystal flaws. Substantial deviations in the carbon and oxygen contents were also exhibited as compared to the rods produced prior to this operation, so that further processing was no longer possible. Furthermore, the graphite crucible exhibited clearly visible cracking and it had to be replaced.

Thus, while only a single embodiment and example of the present invention has been described, it will be obvious that many changes and modifications may be made thereunto, without departing from the spirit and scope of the invention.

What is claimed is:

1. A process for the regeneration of a shaped carbon body following its repeated use in the present of, but without direct contact with, elemental molten silicon, comprising the steps of:
   heating said shaped body in an atmosphere inert to carbon, to a temperature in the range of from 1700° to 3000° C.; and
   maintaining said body at a temperature in said range for a period of time in hours equivalent to from 0.05 to 1 times the value of the wall thickness of the shaped body measured in millimeters; and repeating said heating and maintaining steps after three to twelve uses of said shaped body in a high-temperature process for silicon processing.

2. The process as defined in claim 1, wherein the carbon is graphite, and said atmosphere is inert to graphite.

3. The process as defined in claim 1, wherein a vacuum of $10^{-1}$ to $10^{-3}$ mbar is provided as the inert atmosphere.

4. The process as defined in claim 1, wherein the body is maintained at a temperature of from 1900° to 2200° C. for said period of time.

5. The process as defined in claim 1, wherein following said temperature treatment, said shaped body is cooled to a temperature of less than 500° C. before being removed from said inert atmosphere.

* * * * *